United States Patent [19]

Wong et al.

[11] Patent Number: 5,223,348
[45] Date of Patent: * Jun. 29, 1993

[54] APC ORIENTATION SUPERCONDUCTOR AND PROCESS OF MANUFACTURE

[75] Inventors: James Wong, Wayland; Mark K. Rudziak, Westminister, both of Mass.

[73] Assignee: Composite Materials Technology, Inc., Shrewsbury, Mass.

[*] Notice: The portion of the term of this patent subsequent to Oct. 27, 2009 has been disclaimed.

[21] Appl. No.: 703,174

[22] Filed: May 20, 1991

[51] Int. Cl.$^5$ .................... C22C 1/18; H01L 39/12; H01L 39/24; H01B 12/02

[52] U.S. Cl. .................... 428/635; 428/660; 428/661; 428/930; 148/96; 29/599; 505/814; 505/918; 505/921

[58] Field of Search .............. 428/930, 600, 601, 602, 428/610, 614, 635; 148/11.5 Q, 11.5 F, 96; 29/599; 505/812, 813, 1, 814, 919, 918, 921

[56] References Cited

U.S. PATENT DOCUMENTS

| | | | |
|---|---|---|---|
| 3,218,693 | 11/1965 | Allen et al. | 428/930 |
| 3,395,000 | 7/1966 | Hanak et al. | 428/930 |
| 3,465,430 | 9/1969 | Barber et al. | 29/599 |
| 3,534,459 | 10/1970 | Kudo et al. | 428/930 |
| 3,625,662 | 12/1971 | Roberts et al. | 428/930 |
| 3,652,967 | 3/1972 | Tanaka et al. | 29/599 |
| 3,665,595 | 5/1972 | Tanaka et al. | 29/599 |
| 3,728,165 | 4/1973 | Howlett | 428/930 |
| 3,813,764 | 6/1974 | Tanaka et al. | 428/930 |
| 4,803,310 | 2/1989 | Zeitlin et al. | 29/599 |

OTHER PUBLICATIONS

"Anisotropy of the Critical Current in Solid Solution Superconductor NBTI", K. J. Best, D. Genevey, H. Hillman, L. Krempasky, M. Polak, and B. Turck, IEEE Transaction on Magnetics, MAG-15, No. 1, pp. 395-397 (Jan. 1979).

"Anisotropy of Optimized and not Optimized Technical NBTI Superconductors", K. J. Best, D. Genevey, H. Hillman, L. Krempasky, M. Polak, and B. Turck, IEEE Transactions on Magnetics, MAG-15, No. 1, pp. 765-767 (Jan. 1979).

"Strongly Enhanced Critical Current Density in Nb 47 Wt% Ti Having a Highly Aligned Microstructure", L. D. Cooley, P. D. Jablonski, P. J. Lee, and D. C. Larbalestier, Applied Physics Letters, Jun. 24, 1991 Edition pp. 1-11.

"Properties of Superconducting NbTi Superfine Filament Composites with Diameters <0.1 μm", I. Hlasnik et al, Apr. 1985, Electrotechnical Institute, Electro--Physical Research Centre, Slovak Academy of Sciences, Bratislava, Czechoslovakia, 8 pages.

"Current-Carrying Capacity of Superconductors with Artificial Pinning Centers", G. L. Dorofejev, E. Yu. Klimenko, S. V. Frolov, Kurchatov Inst. of Atomic Energy, Moscow, USSR, 9th International Conference on Magnet Technology, Zurich, 1985, pp. 564-566.

"Restricted Novel Heat Treatments for Obtaining High $J_c$IN Nb46.5wt%Ti" P. J. Lee, J. C. McKinnell and D. C. Larbalestier, App. Superconductivity Ctr. Univ. Wisconsin, no date, 7 pages.

"NbTi Superconductors with Artificial Pinning Structures", Supercollider 2, Plenum Press, N.Y. 1990 pp. 341-348, L. R. Motowidlo, P. Valaris, H. C. Kanithi, M. S. Walker and B. A. Zeitlin, IGC Advanced Superconductors, Inc. 1875 Thomaston Avenue, Waterbury, Conn. 06704.

"Innovations in the Design of Multifilamentary NbTi Superconducting Composites for the Supercollider and Other Applications", E. Gregory et al., Supercon Inc. 830 Boston Turnpike, Shrewsbury, Mass. 01545—no date, pp. 277-284.

*Primary Examiner*—John Zimmerman
*Attorney, Agent, or Firm*—Hayes, Soloway, Hennessey & Hage

[57] ABSTRACT

Artifical pinning centers are provided in normal metal layers adjacent to a type II superconductor layer produced by reacting two normal metal layers. The transverse thicknesses of the final superconductor and normal metal layers are less than about 1000 A°. Planar layers of metal which are to provide a multilayer wire whose layers are parallel. A plurality of the multilayer wires are combined to produce a multifilament superconductor, the layers in all the individual wires being parallel to each other.

8 Claims, 3 Drawing Sheets

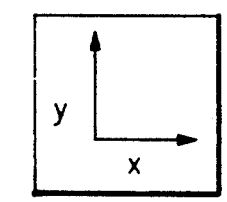
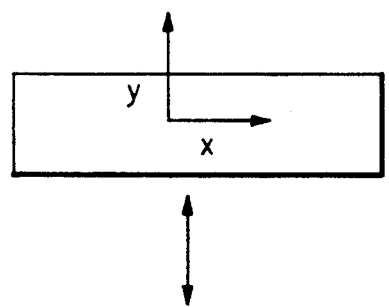
FIG.1(A)   FIG.1(B)
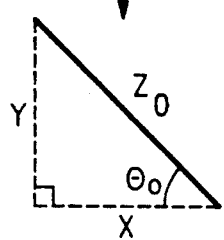
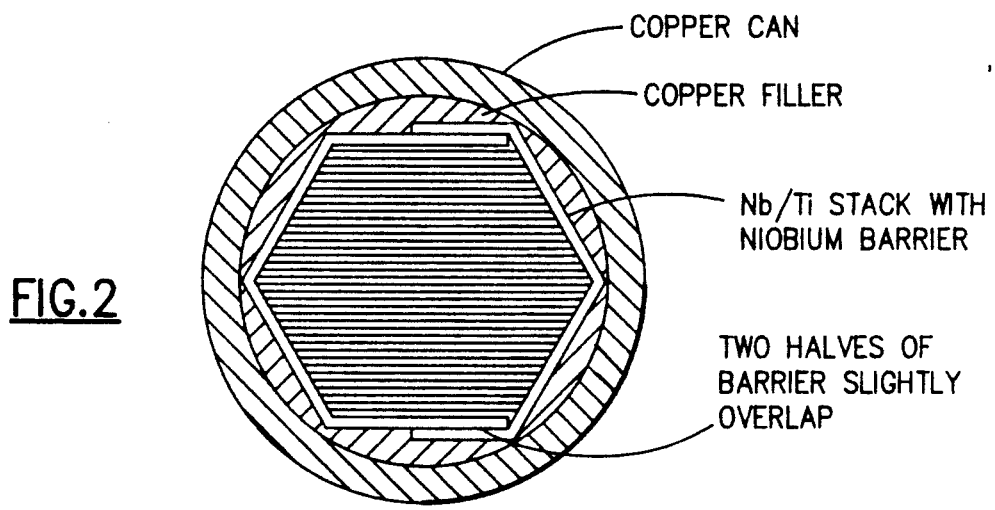
FIG.2
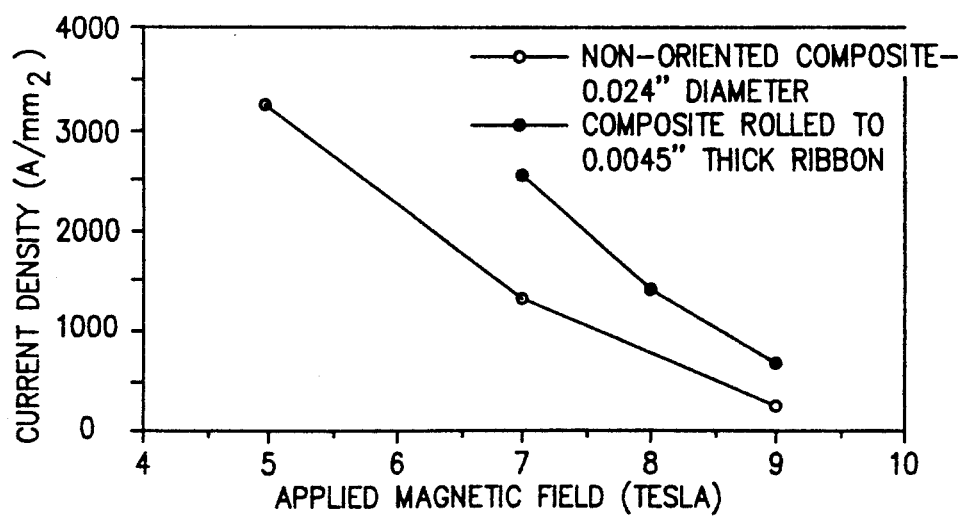
FIG.3

APC ORIENTATION SUPERCONDUCTOR AND PROCESS OF MANUFACTURE

This invention relates to the production of improved superconductors. This invention is an improvement over the invention described and claimed in our co-pending U.S. patent application Ser. No. 07/540,193, now U.S. Pat. NO. 5,160,794, owned by the assignee of the present application. The subject matter of said co-pending application is incorporated herein by reference.

BACKGROUND OF THE INVENTION

It is well known that in order to obtain high current densities ($J_c$'s) in superconducting materials the motion of magnetic flux lines within the material must be prevented, since moving flux lines dissipate energy, causing the superconductor to become "normal", that is, non-superconducting. The mechanism by which flux lines are held in place depends upon the superconductor involved, but in most Type II superconductors the motion of flux lines is restricted predominantly by means of normal precipitates dispersed throughout the superconductor. For this reason, such precipitates are called flux pinning sites.

In NbTi, by far the most commonly used superconductor in industry, the primary flux pinning sites are thin ribbons of nearly pure titanium. For wire applications, the "α-Ti" ribbons are developed through a series of heat treatments separated by strain imparted as a result of drawing. Strain encourages α-Ti to precipitate at NbTi grain boundaries in reaction to a heat treatment. Strain after the final heat treatment elongates the α-Ti, giving these areas a ribbon-like morphology.

The particulars of the NbTi heat treatment schedule depend upon a number of factors: NbTi composition, homogeneity, etc. However, a typical schedule for standard Nb46.5wt % Ti will involve three or more 300° C.-450° C. treatments, 40 to 80 hours in duration separated by areal reductions of about 2.6. The final areal reduction is usually in the range of 50-150.

The best of these schedules produces about 20 volume percent of α-Ti in the NbTi and $J_c$'s in excess of 3000 A/mm$^2$ at 5T and 4.2° K. In wires with these properties, the α-Ti is configured as a dense array of ribbons 10-20A° in thickness, 40-80A° apart, and with the elongation dependent upon the final strain imparted (see, for example, P. J. Lee, J. C. McKinnell, and D. C. Larbalestier, "Restricted Novel Heat Treatments for Obtaining High $J_c$ in Nb46.5% Ti", To be published, presented as paper #HX-03 at ICMC/CEC, Los Angeles, Calif., Jul. 25, 1989).

Recently, a number of researchers have investigated the idea that NbTi wires incorporating artificially produced pinning sites can behave as well or better than standard, heat treated NbTi wire. Work performed by G. L. Dorofejev, E. Yu. Klimenko, and S. V. Frolov, ("Current-Carrying Capacity of Superconductors with Artificial Pinning Centers", Proceedings of the 9th International conference on Magnet Technology, MT-9, Swiss Institute of Nuclear Technology, P. 564–6, Zurich, 1985, ISPN 3-907998-00-6,) demonstrated for the first time that transition metals could be utilized as pinning sites in NbTi. These investigators produced wires containing a Nb50wt % Ti matrix surrounding up to 10$^7$ microfilaments of niobium, titanium, or vanadium. The microfilament spacings were equal to the microfilament diameters. These composites were processed without heat treatment to a variety of sizes for $J_c$ testing. It was found that $J_c$ increased in inverse proportion to the microfilament diameter down to 500A°. Below this size, mechanical and diffusional effects began to degrade the properties. The best of the composites, incorporating niobium filaments in the NbTi matrix, displayed a $J_c$ of 3500 A/mm$^2$ at 5T and 4.2° K.

In work performed by I. Hlasnik et al. ("Properties of Superconducting NbTi Superfine Filament Composites with Diameters <0.1 μm, Cryogenics, vol. 25, October, 1985), Cu NbTi composites consisting of 9,393,931 NbTi filaments embedded in Cu were fabricated via multiple restacking and cold drawing operations. No special heat treatments were employed during processing.

NbTi filament diameters as low as 200A° were achieved, along with Cu matrix thicknesses of 100A°. A peak $J_c$ of approximately 3000 A/mm$^2$ (5T, 4.2K) was observed corresponding to a 500A° filament diameter. When the composite was reduced below this point, current density rapidly declined, consistent with the findings of Dorofejev et al.

Recent work by L. R. Motowidlo, P. Valaris, H. C. Kanithi, M. S. Walker, and B. A. Zeitlin ("NbTi Superconductors with Artificial Pinning Structures", Supercollider 2, pp. 341–348, Edited by M. McAshan, Plenum Press, New York, 1990) transposed the positions of the niobium and NbTi relative to the approach of Dorofejev et al., placing the NbTi within a niobium matrix.(see also U.S Pat. No. 4,803,310) Employing multiple restacks, the investigators produced a multifilament wire containing 83,509 filaments, each containing 61 niobium-clad NbTi subelements. In a version of the composite containing a 3:1 ratio of NbTi to niobium, the experimenters obtained a $J_c$ of 2893 A/mm$^2$ at 5T and 4.2K. This $J_c$ was achieved without heat treatment, the investigators simply drew the composite to its 0.024" optimum diameter Overall, the composite showed excellent low field (<5T) $J_c$, but very poor high field $J_c$. Upper critical field for the composite was estimated at only about 8T, well below that for conventional NbTi (11T). Nonetheless, the work clearly demonstrated artificial pinning in NbTi.

In our copending U.S. patent application Ser. No. 07/540,193, now U.S. Pat. No. 5,160,794, filed Jun. 19, 1990 there is described an artificially structured superconducting composite that does not rely on alloy materials. Two or more pure metals, such as niobium and titanium, are alternately layered into a billet, which is then processed into wire. This wire is stacked into a second billet, which is hot isostatically pressed (HIP'd) and hot extruded into a rod. The composite rod is then drawn down to wire. The hot processing of the secondary billet causes the thin, pure metal layers to diffuse, resulting in superconducting material (e.g., NbTi) at their interfaces. The diffusion is incomplete, so some nearly pure, normal metal remains in the composite. The composite structure thus consists of superconducting material threaded through with normal material, as in the other artificially structured composites. When the composite is reduced to a point at which the superconducting/normal layers are less than 1000A° thick, the normal layers serve as efficient pinning sites for the superconductor. These sites, it should be noted, are not truly layers when they are fully reduced; the mechanical working causes the initial layers to break up into ribbons, so their morphology is much the same as that for α-Ti in conventional NbTi. By the process, described in the above copending application there is produced a 0.024" wire displaying a non-copper $J_c$ in excess of 3200 A/mm$^2$ at 5T and 4.2K, in line with the current densities observed in the artificially pinned composites produced by other methods.

One aspect of pinning in NbTi (be it natural or artificial) which has not been widely investigated is the effect of pinning site orientation. What limited research has been done has shown that significant increases in the current density of conventional NbTi can be obtained if the pinning sites are oriented parallel to the applied magnetic field direction.

Best et al. ("Anisotropy of the Critical Current in Solid Solution Superconductor NbTi", K. J. Best, D. Genevey, H. Hillman, L. Krempasky, M. Polak, and B. Turck, *IEEE Transaction on Magnetics*, MAG-15, No. 1, pp. 395–397, January 1979) cold-rolled Nb50wt % Ti monofilamentary wires and found that:

a) Very high current densities could be achieved if the applied magnetic filed was oriented parallel to the rolled surface of the ribbon-i.e., along its width. In a sample having an aspect ratio (ratio of width to thickness of 12.5:1, Best et al. measured a current density of approximately 3150 A/mm$^2$ (5T, 4.2K) with the field applied parallel to the width of the ribbon.

b) The current density was highly anisotropic. The same ribbon that displayed 3150 A/mm$^2$ with the field parallel gave only about 450 A/mm$^2$ with the same field applied perpendicular to the rolled surface.

Best et al. also discovered that the parallel field current density and the degree of current density anisotropy increased with increasing aspect ratio up to aspect ratios of 13 (for fixed cross-sectional area). All of these effects were observed in multifilament NbTi conductors as well ("Anisotropy of Optimized and Not Optimized Technical NbTi Superconductors", K. J. Best, D. Genevey, H. Hillman, L. Krempasky, M. Polack, and B. Turck, *IEEE Transactions on Magnetics*, MAG-15, No. 1, pp. 765–767, January, 1979).

More recent work by Cooley et al. ("Strongly Enhanced Critical Current Density in Nb47wt % Ti Having a Highly Aligned Microstructure", L. D. Cooley, P. D. Jablonski, P. J. Lee, and D. C. Larbalestier, To Be Published in the Jun. 24, 1991 Edition of Applied Physics Letters) confirmed the results of Best et al. and attained even higher parallel field current densities. By rolling Nb47wt % Ti monofilamentary wire, the investigators obtained a current density of 5200 A/mm$^2$ (5T, 4.2K) in a ribbon with the applied field parallel to its width. This is the highest current density ever reported for NbTi wire or ribbon, and it is fully 66% higher than the current density the investigators were able to achieve in a round wire at the same temperature and field. Strong current density anisotropy was also observed. For one sample, the perpendicular field current density was found to be less than 8% of the parallel field current density.

The reason that rolled NbTi has high parallel field current density is that rolling tends to align the α-Ti pinning sites with the rolled surface of the ribbon. To see why the pinning sites align, one must first understand that the flattening of a wire or ribbon constitutes a redistribution of material from the center toward the edges (assuming no change in cross-sectional area). This redistribution can be thought of as two simultaneous actions, the first a reduction of the dimension perpendicular to the rolled surface, the second a proportional increase in the dimension parallel to the surface. FIG. 1 illustrates what happens as a result of these changes. Referring to FIG. 1A, suppose we have a strip with a square cross section. Inside this strip is a ribbon of α-Ti, represented by the bold line in the figure. The ribbon has length $Z_o$. As indicated, the direction and y-direction are each chosen so as to be parallel with two sides of the square, but orthogonal to each other. The α-Ti ribbon then forms angle $\theta_o$ with the x-direction. The distances X and Y are along the x and y directions.(in the figure x=y) They correspond to the arms of a right triangle having length $Z_o$ at the hypotenuse. From basic trigonometry, one can derive the equation $\tan \theta_o = Y/X$.

Suppose now that an experimenter rolls the square strip into a rectangle, choosing as the rolling surface that face which is parallel to the x-direction (see FIG. 1B). The flattening is pure in that the cross-sectional area is unchanged in the rectangle. Suppose the rectangle has some aspect ratio A (A > 1). For the α-Ti ribbon, the flattening reduces the initial distance Y to $Y/\sqrt{A}$, increases the distance X to $(\sqrt{A})X$, narrows the angle $\theta_o$ to $\theta_f$, and lengthens the ribbon to $Z_f$. As above, it follows that $\tan \theta_f = (Y/\sqrt{A})/(\sqrt{A})X)$, i.e., $\tan \theta_f = Y/AX$. Using the earlier equation, one can say that $\tan \theta_f / \tan \theta_o = 1/A$. This means that as A increases, $\theta_f$ falls very rapidly to values near zero. In FIG. 1, $\theta_o$ is 45° and the aspect ratio A is 4. Even for this relatively low ratio, $\theta_f$ is down to only 14°. This rapid reduction in $\theta_f$ translates as greater and greater alignment of the α-Ti ribbon with the x-axis as the aspect ratio increases. In this way, roll flattening of NbTi wires rapidly aligns the bulk of the α-Ti pinning sites both with each other and with the rolled surface of the strip.

Pinning site alignment increases current density because aligned pinning sites provide better flux paths, and thus better pinning, than non-aligned pinning sites. The ideal situation is that in which the pinning site runs straight across the body of the superconductor. Then, when the applied magnetic field is parallel to the pinning sites, the flux is pinned all the way across the superconductor (assuming the pinning site spacing is correct for the magnetic field level). Maximum current density results. The worst situation (all other things being equal) will obtain at 90° to the best configuration, where the least amount of pinning material possible intersects the flux lines across the superconductor, and there is no continuous flux path. An intermediate situation is found in, for example, the composite of Zeitlin et al.. In this composite, the flux paths are continuous, but not straight. Less than optimum current density results.

It follows from this discussion that a NbTi conductor having perfectly aligned, planar pinning sites must have extremely high current density when aligned parallel to the field and near zero $J_c$ when aligned orthogonally. Indeed, the value with parallel alignment must be at least double that found in a comparable wire, where, on average, half the sites are aligned parallel and half perpendicular, and no anisotropy is found. Based on current densities seen in round wires, one should be able to obtain oriented current densities in excess of 6000 A/mm$^2$ at 5T and 4.2K. Unfortunately, to get such high current densities in conventional NbTi would require very high aspect ratios that would have to be imposed after the final heat treatment in order to align the bulk of the α-Ti ribbons. The limited ductility of heat treated NbTi makes this difficult to accomplish. Furthermore, a highly aspected strip is not particularly useful in today's magnet industry, which relies almost exclusively on wire.

Artificially structured NbTi composites of the type described in our above copending application are better suited to orientation than is conventional NbTi. If proper materials are utilized, such composites are quite ductile, allowing a high degree of deformation and consequent orientation of initially non-oriented pinning sites. An experiment performed by Applicants focused on obtaining optimum parallel field current density in an oriented, artificially structured composite. The processing of the composite proceeded in three stages: monofilament processing, multifilament processing, and orientation. The monofilament consisted of a copper can having a 1.86" internal diameter and 2.50" outer diameter, containing a stack of 0.010" thick niobium and 0.016" titanium sheets. The sheets were arranged so as to alternate the niobium and titanium, and they were cut to widths such that the overall cross section of the stack was hexagonal (see FIG. 2). The stack contained 58 niobium sheets and 59 titanium sheets (the odd titanium sheet was placed at the center of the symmetrical hexagon). The purpose of the hexagonal shape was to ensure a tight pack in the secondary billet. The hexagonal stack was surrounded by a 0.010" thick niobium barrier to prevent copper contamination in the core. The overall stack length was 6.00". All materials were cleaned prior to billet assembly. The void space in the billet was minimized by packing copper rods into the spaces at the flats of the hexagonal stack.

After assembly, the nose and tail of the billet were electron beam welded into place under vacuum, thereby sealing the billet shut. This billet was then HIP'd at 650° C., 15 ksi for 4 hours. The HIP'd billet was machined to 2.0" in diameter prior to extrusion. A 2 hour heat at 650° C. preceded extrusion at 650°, 15 ipm from the 2.0" billet diameter to an extruded diameter of 0.50". This rod was cropped to remove the excess copper at the nose and tail and then cold drawn at an areal reduction rate of 20% to a final diameter of 0.030". The wire was straightened and cut into 4.75" lengths. The copper was pickled off of these filaments by immersing them in a nitric acid solution. Approximately 4000 filaments were stacked into a copper can having a 1.75" internal diameter and a 2.50" outer diameter The can was lined with a 0.010" niobium barrier. This secondary billet was welded, HIP'd and extruded in just the same way as the monofilament billet except that the extrusion diameter was 0.625".

After the extrusion was cropped, the investigation of orientation effects began. First, a section of the composite was drawn at a rate of 20% areal reduction per pass to a series of wire diameters. Samples at these diameters were tested for current density at 4.2K and applied magnetic fields up to 9T. The best overall performance for the drawn composite was found to occur at 0.024" diameter, where a non-copper $J_c$ in excess of 3200 A/mm$^2$ was measured at a field of 5T. Based on an initial Nb/Ti average layer thickness of 0.013", the 0.024" wire had an average layer thickness of about 600A°. The actual superconducting and normal layer thicknesses were expected to be a fraction of this. The performance of the 0.024" diameter wire was taken as a baseline which to judge the oriented composites subsequently produced.

Strips of oriented material were generated by rolling down wires having the following diameters: 0.625", 0.082", 0.0575", 0.039" and 0.024". Each wire was cold rolled into ribbons having thicknesses between 0.015" and 0.002". Measurements revealed the highest $J_c$'s in a 0.0045" by 0.200" ribbon rolled from 0.039" diameter wire. $J_c$(4.2K) was measured at 2525 A/mm$^2$ at 7T and 660.4 A/mm$^2$ at 9T, with the field applied parallel to the wide surface of the ribbon. These data are shown in the plot of FIG. 3, along with the $J_c$'s for the optimized round wire. Based on the data, a 5T $J_c$ in excess of 6000 A/mm$^2$ has been projected. This is roughly double the value seen in both the non-oriented composite and in the best conventional NbTi wire. Preliminary measurements with field perpendicular to the samples indicated $J_c$ values less than 15% of the parallel values (less than 5% at 9T), as was expected.

FIG. 4 shows a plot of the data obtained by Best et al., Cooley et al., and Applicants' for rolled ribbons of superconductor. The Best et al. data are from the paper dealing with rolled NbTi monofilament, cited above. The Cooley et al. data are from the paper cited above for these investigators. The plot indicates that the Applicants' composite performed much as did the standard heat treated NbTi alloy examined by the other researchers.

It is not surprising that optimum $J_c$ for the Applicants' composite was found in the 0.039" wire rolled to 0.0045" by 0.200", since the non-copper dimensions of that strip corresponded to a 0.024" diameter wire, the size at which the round composite was found to have the best performance. For the same reason, it was not surprising that the strips rolled from the 0.024" diameter wire showed inferior $J_c$, since the rolling reduced the pinning layers to below their optimum size. The larger diameter wires might be expected to achieve high $J_c$ at small ribbon thicknesses (smaller than for the 0.039" wire), but this turned out to be true only in principle. In practice, the rolling eventually results in shear failure within the composite. The material simply gives way along slip planes oriented at 45° to the rolling surface, causing a precipitous decline in current density. This effect was seen to occur regardless of the initial wire size, with the breakdown beginning at larger ribbon thicknesses for larger initial wire diameters. Due to this shear effect, none of the larger diameter wires achieved the same current density observed in the ribbon rolled from the 0.039" diameter wire, although parallel field densities were nearly always seen to increase as compared to the non-oriented wire.

The above described experiment by Applicants' demonstrated that high parallel field current densities can be obtained in artificially structured composites by rolling them from wire into strips having the proper dimensions for optimum pinning layer thicknesses. For the highest degree of orientation, one starts with the largest diameter wire that it is possible to use without introducing mechanical problems.

Despite the good parallel field results that can be obtained by rolling NbTi-based conductors, rolling does not provide a perfect pinning structure. One problem is that any pinning layers that are initially oriented perpendicular or nearly perpendicular to the rolling surface will tend to shorten and grow thicker as the strip is flattened, just the opposite of what happens to the layers oriented parallel to the rolling surface. This is the situation where $\theta_o$, in the equation above, is at or near 90°, so than $\tan\theta_o$ is very large. Because these layers grow thicker rather than thinner and are not oriented parallel to the rolling surface, they serve as poor parallel field pinning sites.

Another problem with rolling a wire is that, if it is initially round, the pinning layer will deform non-uniformly along the width of the strip. The initial flattening of the wire results in greater deformation at the center part of the resulting strip than at the edges. The pinning layers at the center are accordingly both more highly oriented and thinner than those at the edges. Optimum layer thickness and orientation thus cannot be achieved throughout the composite. These problems can be avoided if the initial wire cross section is rectangular, but this will not usually be the case.

For artificially structured composites, it is possible to bypass the problems with rolling the material by simply not rolling it. Instead, one can achieve pinning layer orientation by artificially structuring the final composite. A method by which to accomplish this forms the subject of the present invention.

BRIEF DESCRIPTION OF THE INVENTION

The product of the present invention is a Type II superconducting composite displaying high current density at all magnetic fields by virtue of pinning layers oriented parallel to the magnetic field direction. The current density with field parallel to the pinning layers is at least twice that of a non-oriented composite, and is negligible with field perpendicular to the layers. The composite is fabricated by stacking alternating layer of metal (niobium and titanium, for example) into a billet, reducing the billet to wire, restacking the wires into a secondary billet, hot processing the secondary billet so as to form superconducting alloy (NbTi, e.g.) zones at the layer interfaces, and then drawing this material to a size at which the average layer thickness is near 1000A°, where the remaining, undiffused normal metal regions can serve as pinning sites. In another embodiment of the invention, two restacking operations, rather than one, are employed to make fabrication easier. In all cases, the final wire is indexed in some way in order that the proper alignment may be discerned. The pinning layers in the final composite are highly aligned so that when the composite is appropriately oriented with respect to an applied magnetic field, current density exceeding that of a comparable non-oriented composite is observed.

DETAILED DESCRIPTION OF THE INVENTION

In order to more fully understand the invention, reference should be had to the following detailed description taken in conjunction with the attached drawings, wherein:

FIGS. 1(A) and 1(B) are schematic diagrams showing the effect of flattening on a ribbon of α-Ti contained within a NbTi conductor having a square cross section. A) Situation before flattening. B) Situation after flattening to an aspect ratio of 2.

FIG. 2 is a schematic diagram of a monofilament billet containing an hexagonal stack of niobium and titanium sheets.

FIG. 3 is a plot of current density versus magnetic field data for a non-oriented composite and a composite oriented by cold rolling (parallel field).

Figure 4:
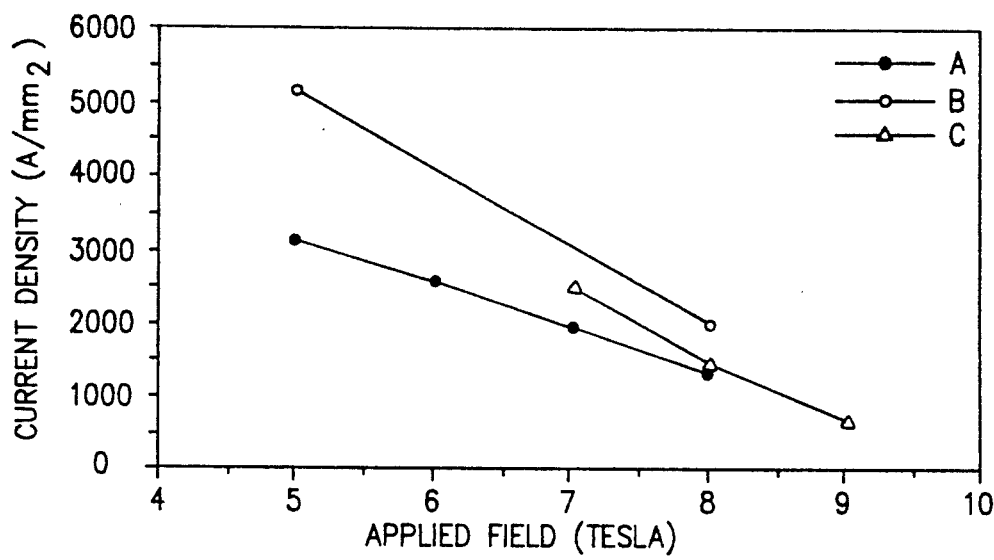
FIG. 4 is a plot of current density (parallel field) versus magnetic field data for ribbons produced by A) Best et al.; B) Cooley et al.; and C) Applicants'.

The invention requires the use of an artificially structured superconducting composite. The preferred composite is that developed by Applicants' and briefly described above. Unlike the other artificially structured materials, it is possible—indeed, necessary—to process composites at elevated temperatures. High temperature operations such as HIP'ing and hot extrusion promote metal-to-metal bonding in composite structures. This in turn greatly improves the workability of a composite and the reproducibility of the desired properties. The hot processing of superconducting composites containing, for example, NbTi and a pinning material like niobium tends to dramatically depress current densities due to diffusion between the constituents, so such composites usually must be processed at room temperature. Inferior bonding and poor workability are the inevitable result.

The composite of the type described in our above copending application begins as a monofilament billet containing alternating layers of two or more pure metals, generally in the form of sheets. For niobium and titanium, which will be treated here as the model case, it has been found that the best results are obtained when the niobium and titanium layer thicknesses are in a ratio between 1:1 and 2:1 (Ti:Nb). The layers may be configured in any way, but will typically be wrapped around a ductile support in "jelly-roll" fashion or will simply be stacked. In either case, the copper-clad monofilament billet is extruded and then drawn down to wire. This material is straightened, cut into short lengths, and then restacked into a secondary billet. In order to optimize mechanical support between the filaments in the secondary billet, the copper may be pickled off of them prior to restack, so that the secondary billet consists of a copper can surrounding a solid core of copper-free filaments. Alternatively, one may leave the copper on the filaments and hence produce a true multifilament billet.

The multifilament billet is HIP'd and then extruded into a rod. The diffusion generated during these operations causes the formation of superconducting NbTi at the Nb/Ti interfaces. The diffusion should result in roughly equal volumes of niobium, titanium, and NbTi. When the extrusion is reduced by drawing or rolling to a size at which the superconducting/normal layers are less than 1000A° in thickness, the normal layers serve as flux pinning sites for the NbTi.

The thickness of the normal and superconducting layers is critical to the performance of the composite. If the layer thicknesses are too great, i.e., not on the order of the fluxoid spacing at the particular magnetic field, then inefficient pinning results. On the other hand, if the layers are reduced too much, proximity effects are introduced, resulting in depressed critical current density and lower upper critical field.

To obtain aligned pinning layers in the final composite without rolling, one begins with the monofilament billet, in which the niobium and titanium sheets are stacked into a rectangular shape. The void space in the round billet is filled with copper. When this billet is processed into wire and the copper is pickled off, rectangular filaments result. These filaments are stacked in the secondary billet so that their wide sides are aligned. A visually distinct metal is placed in the wall of the copper extrusion can so that the aligned orientation can be identified in the final wire. The billet is then processed into wire using standard extrusion and wire drawing. Since the wire is round, drawing exerts an isostatic force on the core of filaments. This ensures that the pinning layers are deformed uniformly. Complete, planar alignment of the layers is guaranteed by the arrangement of the filaments in the secondary billet. In particular, there are no regions corresponding to the $\theta_o = 90°$ situation that limits the current densities of initially random, rolled materials. When the layers of the oriented composite are the appropriate size, and the wire is properly aligned as indicated by the marker, maximum current density at all fields is obtained.

Due to the difficulty of aligning small rectangular filaments, one can, alternatively, stack the first filaments at a large size, still in an aligned array, extrude and draw this secondary billet, and then stack these secondary filaments (also at large size, also in an aligned array) into the final billet.

In another embodiment, one can index the final billet by shaping an inner copper can containing the restacked filaments, surrounding this can with an etching barrier, and inserting the whole assembly into an outer extrusion can. The inner can may be shaped, for example, so as to have flat regions that correspond to a specific pinning layer orientation. At the final wire size, both the outer can and the barrier are removed to reveal the flats.

The above methods for obtaining pinning site alignment could be modified in a number of ways that do not depart from the essence of the invention. For example, the monofilament could be marked so that copper clad filaments could be used in the secondary billet, the filaments still being arranged for optimum alignment. Of course, it is also possible to use layers of metals other than niobium and titanium in the monofilament billet, niobium and zirconium, for example. So long as the composite is ductile, and Type II superconducting layers can be formed by diffusion, any set of metals may be used in the composite.

In accordance with the invention, artificially structured superconducting composites with oriented pinning sites can be fabricated as described in the following non-limiting examples.

EXAMPLE I

Figure 5:
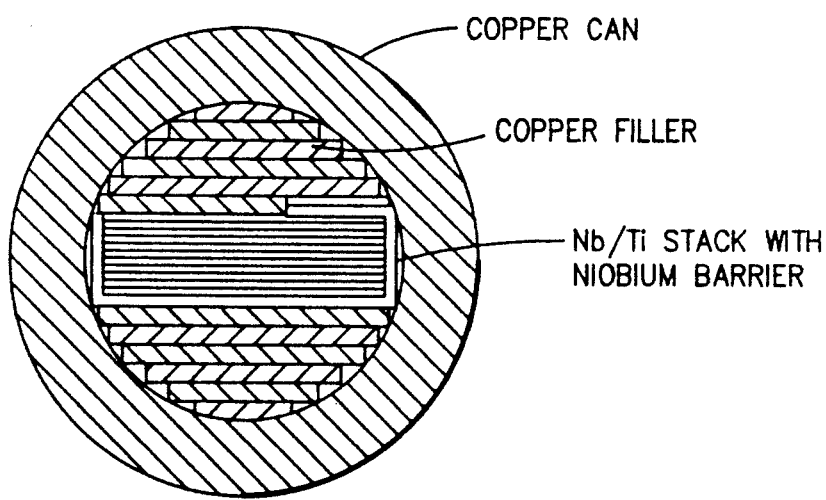
FIG. 5 is a schematic diagram of a monofilament billet containing a rectangular stack of niobium and titanium sheets.

The method begins with the monofilament billet, containing alternating layers of 0.010" thick niobium sheet and 0.016" titanium sheet. Twenty sections of the niobium sheet and twenty-one sections of the titanium sheet are cut into rectangles 1.608" wide and 6.00" long. They are cleaned and then stacked alternately so as to form a rectangle 0.536" high and 1.608" wide (3:1 aspect ratio), with titanium exposed at the top and bottom of the stack. The stack is wrapped with a 0.010" thick niobium diffusion barrier and the whole assembly is inserted into a copper extrusion can having an internal diameter of 1.73" and an outer diameter of 2.50". The void space surrounding the stack is filled with copper rods and/or sheets. A diagram of the assembled billet is shown in FIG. 5. In order that there be sufficient material for restacking, two monofilament billets of the type just described must be constructed.

Figure 6:
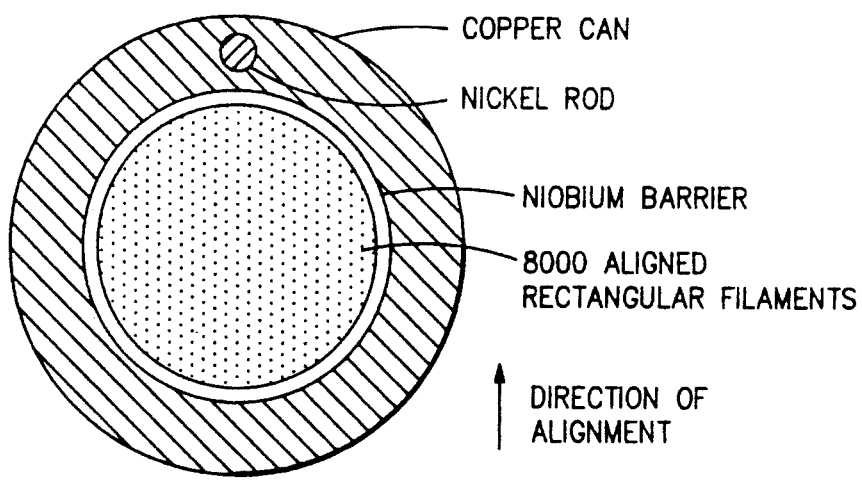
FIG. 6 is a schematic diagram of a secondary billet containing approximately 8000 rectangular composite filaments. The filaments are aligned with each other direction of alignment being indicated by a nickel marker in the extrusion can wall.

After assembly, the noses and tails of the billet are electron beam welded into place under vacuum. The billet was then HIP'd at 650° C., 15 ksi for 4 hours. The HIP'd billets are machined to 2.00", heated at 650° C., for 2 hours, and then extruded at 650° C., 15 ipm to a diameter of 0.50". After the excess copper has been cropped off of the noses and tails, the extruded rods are drawn down at an areal reduction rate of 20% per die pass to a final diameter of 0.030". This material is then straightened and cut into 4.25" long filaments. These filament are immersed in a nitric acid solution in order to remove their copper cladding and expose the rectangular cores. Approximately 8000 of the filament are stacked into a copper can lined with a 0.010" niobium diffusion barrier. The stacking is done so as to align the wider sides of the filaments along one direction. The copper can has an internal diameter of 1.60" and an outer diameter of 2.50". The can wall incorporates a marker metal: a nickel rod 0.20" in diameter that fits into a 0.20" diameter hole drilled at a position 1.05" from the center of the can. When the aligned assembly of filaments is inserted into the can, it is positioned so that the nickel rod marks a direction that is parallel to the planes of filament alignment-i.e., a direction parallel to the wider sides of the filaments. A diagram of the assembled secondary billet is shown in FIG. 6.

The secondary billet is welded and HIP'd as described above for the monofilament billet. It is then machined to 2.00" in diameter, the machining serving to expose the nickel marker metal. The billet is extruded as described above, cropped, and then drawn down to 0.024" in diameter, where the average Nb/Ti layer thickness is about 600A° and optimum flux pinning occurs. When this wire is oriented so that the direction of an applied magnetic field is parallel with the line described by the marker metal and the center of the wire, maximum $J_c$ is observed. Based on the results obtained by Applicants' for rolled composites, a current density approaching 7000 A/mm$^2$ at 5T and 4.2K should be achieved.

It can be difficult to align small, rectangular filaments like those described in this example. A method that allows the use of larger, more easily aligned filaments is described in the following non-limiting example.

EXAMPLE II

A monofilament billet similar to that of Example I is assembled. Twenty-six sections of 0.010" thick Nb sheet and twenty-seven sections of 0.016" thick Ti are cut to 1.47" wide by 6.00" long. They are cleaned, stacked, and surrounded by a Nb barrier just as in Example I. The resulting stack is 1.49" wide and 0.71" high, for an aspect ratio of about 2:1. The aspect ratio here is not as large as in Example I, because the restack size of the filaments is larger, making it easier to discern the proper orientation.

The stack of Nb and Ti sheets is inserted into a copper can having an internal diameter of 1.69" and an outer diameter of 2.50". The void space around the stack is filled with copper sheets and/or rods. The resulting billet is similar to that shown schematically in FIG. 5.

Figure 7:
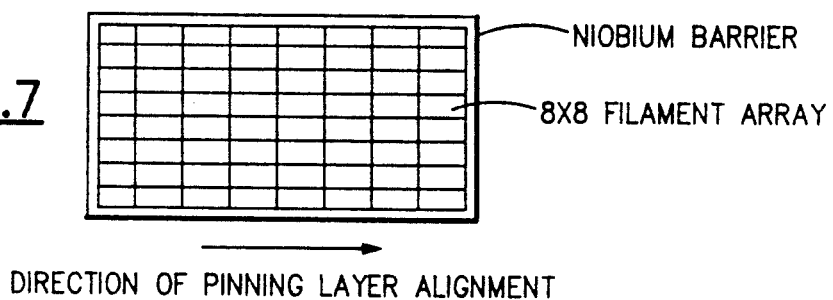
FIG. 7 is a schematic diagram showing an 8×8 array of oriented rectangular composite filaments.

The monofilament billet is welded, HIP'd, extruded, and drawn as described in Example I, except that the final diameter is 0.250", not 0.030". The 0.250" diameter rod is straightened and cut into 5" lengths. The copper cladding is pickled off, and the resulting rectangular filaments are stacked into an 8×8 array as shown in FIG. 7. Note that the filaments are all oriented the same way. The stack of filaments is surrounded by a 0.010" Nb barrier and is then inserted into a copper extrusion can as before.

Figure 8:
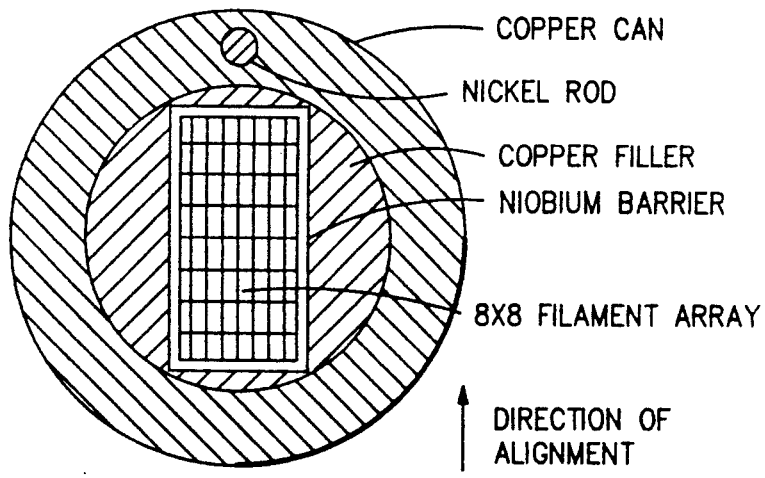
FIG. 8 is a schematic diagram of a multifilament billet containing an 8×8 array of oriented rectangular composite filaments. The direction of orientation is indicated by a nickel rod.

The secondary billet is welded, HIP'd, extruded and drawn as was the monofilament, except that the final diameter this time is 0.240". The 0.240" diameter rod is straightened and cut into 4.00" lengths. The copper is pickled off, and the resulting rectangular filaments are again stacked into an 8×8 array. This array is wrapped with 0.010" Nb sheet and is then inserted into a copper extrusion can having the design shown in FIG. 8. The 0.20" diameter nickel marker rod is centered at a radius of 1.00". As before, it marks the plane of layer alignment. This billet is HIP'd, machined, extruded, and drawn just like the final billet of Example I. The result is a completely aligned structure, just as in Example I, obtained without the difficulties associated with restacking very small filaments.

Using marker metals to index a wire can cause practical problems. Chief among these is the problem of keeping the final wire in the proper orientation with only a visual guide. A shaped wire can ensure proper orientation if the shape is such that the wire can only be wound in one way, the right way. The following, non-limiting example describes a method by which to make a shaped, oriented composite wire without resorting to rolling or to some other non-isostatic operation.

EXAMPLE III

The monofilament and secondary stage assembly and processing steps described in Example II are carried out. The final 8×8 stack is assembled and wrapped with the 0.010" thick Nb barrier and is then inserted into a copper HIP can. This can has an internal diameter of 1.69" and an outer diameter of 2.31". The nose and tail of the can are flat, so that the assembled can is simply a regular right cylinder (i.e., the nose is not chamfered, as it would be for an extrusion billet). The void space around the stack is filled with copper as usual.

Figure 9:
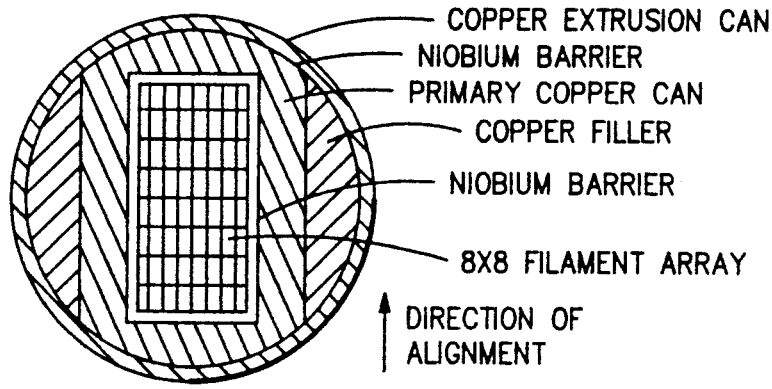
FIG. 9 is a schematic diagram of a multifilament billet containing an 8×8 array of oriented rectangular composite filaments. The direction of orientation is parallel to the flats on the inner can.

The HIP billet is electron beam welded shut in vacuum and is then HIP'd at 650° C., 15 ksi for 4 hours. The HIP'd billet is machined to a diameter of 1.83". One end is then machined back in order to expose the array of filaments. Two flats are then machined into the billet, corresponding to the longer sides of the rectangular filament array. The machined billet is wrapped with two turns of 0.010" thick Nb sheet and this assembly is then inserted into an extrusion can having an inner diameter of 1.875" and an outer diameter of 2.00". The void space in the billet is filled with copper rod or sheet as usual. The assembled billet cross section is shown schematically in FIG. 9. The nose and tail of the assembled billet are electron beam welded into place under vacuum. The billet is then extruded and drawn down as described in Example I, above.

At the final wire size, the outer copper is pickled off using a nitric acid solution (50% $HNO_3$ + 50% $H_2O$). The Nb barrier is then removed by immersing the wire in a solution of hydrofluoric and nitric acids (48% HF + 2% $HNO_3$ + 50% $H_2O$). In this way, the inner copper, with the flats, is exposed. When the wire is wound—into a magnet, for example—it settles on the flats, not the rounded edges. Since the flats correspond to the correct alignment for a parallel magnetic field, maximum parallel field current density is guaranteed, and without having to discern a thin strip of metal in the copper cladding.

While several preferred forms of the invention have been described above, numerous modifications thereof can be practiced without departing from the spirit of the invention.

We claim:

1. In a Method for producing a superconductor comprising the steps of combining a plurality of metal bodies to form a composite structure, said metal bodies being selected from the transition metals niobium, titanium, zirconium or vanadium, alternate bodies being formed of different transition metals to form pairs, reacting the transition metals to cause diffusion of at least one metal into the other metal to form a ductile superconducting alloy as a result of this diffusion, limiting the extent of the reaction so as to maintain the cross-sectional thickness of pure or nearly pure essentially undiffused transition metal along with the superconducting alloy in at least one of each said pair of transition metals which is about equal to the thickness of diffused superconducting alloy, with a partially diffused zone separating each superconducting zone from each undiffused zone, mechanically reducing the composite structure and providing further diffusion to produce a superconducting layer in contact with a non superconducting layer in each said pair, each said layer being less than 1000 A° thick, the improvement wherein planar layers of metal which are to provide the superconducting and normal metal layers are coreduced to produce a multilayer wire having a rectangular cross section, with a greater width than thickness, whose layers are parallel to the long dimension of the cross section, and forming a superconducting wire from said coreduced wire to provide a product having a multiplicity of rectangular superconductor wires with their long cross-sectional dimensions aligned.

2. The produce made by the method of claim 1 wherein the superconductor layer and normal layer each has a ratio of width to thickness of at least 100 to 1.

3. In a superconducting magnetic coil, the improvement wherein the center portion of the coil has superconductor layers made by the method of claim 1, with the planar layers parallel to the magnetic flux lines produced by the coil and with the edges of said coil being formed of superconductor fibers isotropically arranged in a normal metal matrix.

4. The process of claim 1 wherein multiple reduction steps are employed with restacking of the rectangular metal wires between reduction steps, with the long dimensions of the rectangular cross sections being aligned on each restacking before further reduction.

5. The process of claim 4 wherein at least some of the reduction steps are made by extruding and/or drawing planar layers of metal encased in a ductile round casing and indicia are provided in the casing for locating the planes of the metal layers.

6. The product made by the method of claim 1 wherein the superconductor layer and normal layer each has a ratio of width to thickness of at least 100 to 1.

7. In a Method for producing a superconductor comprising the steps of combining a plurality of metal bodies to form a composite structure, said metal bodies being selected from the transition metals niobium, titanium, zirconium or vanadium, alternate bodies being formed of different transition metals to form pairs, reacting the transition metals to cause diffusion of at least one metal into the other metal to form a ductile superconducting alloy as a result of this diffusion, limiting the extent of the reaction so as to maintain the cross-sectional thickness of pure or nearly pure essentially undiffused transition metal along with the superconducting alloy in at least one of each said pair of transition metals which is about equal to the thickness of diffused superconducting alloy, with a partially diffused zone separating each superconducting zone from each undiffused zone, mechanically reducing the composite structure and providing further diffusion to produce a superconducting layer in contact with a non superconducting layer in each said pair, each said layer being less than 1000 A° thick, the improvement wherein planar layers of metal which are to provide the superconducting and normal metal layers are coreduced to produce a multilayer wire whose layers are parallel, combining a plurality of said multilayer wires to produce a multifilament superconductor, the layers in all the individual wires being parallel to each other.

8. The process of claim 7 wherein each superconductor layer and each normal layer has a ratio of width to thickness of at least 100 to 1.

* * * * *

UNITED STATES PATENT AND TRADEMARK OFFICE
CERTIFICATE OF CORRECTION

PATENT NO. : 5,223,348
DATED : June 29, 1993
INVENTOR(S) : James Wong and Mark K. Rudziak It is certified that error appears in the above-indentified patent and that said Letters Patent is hereby corrected as shown below:

Claim 6, col. 12, lines 61-64, "6. The product made by the method of claim 1 wherein the superconductor layer and normal layer each has a ratio of width to thickness of at least 100 to 1" should read --6. A superconducting wire make by the method of claim 1.--.

Claim 2, col. 12, line 40, "produce" should read --product--.

Signed and Sealed this

Seventh Day of June, 1994

Attest:

BRUCE LEHMAN

Attesting Officer

Commissioner of Patents and Trademarks